(12) United States Patent
Shizuno

(10) Patent No.: US 8,381,394 B2
(45) Date of Patent: Feb. 26, 2013

(54) CIRCUIT BOARD WITH EMBEDDED COMPONENT AND METHOD OF MANUFACTURING SAME

(75) Inventor: Yoshinori Shizuno, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/166,868

(22) Filed: Jun. 23, 2011

(65) Prior Publication Data

US 2011/0247211 A1 Oct. 13, 2011

Related U.S. Application Data

(62) Division of application No. 11/273,339, filed on Nov. 15, 2005, now Pat. No. 7,989,706.

(30) Foreign Application Priority Data

Nov. 19, 2004 (JP) .................................. 2004-336264

(51) Int. Cl.
*H05K 3/36* (2006.01)
(52) U.S. Cl. ................. 29/830; 29/831; 29/832; 29/833; 29/834; 29/852; 174/260; 174/261; 361/760; 361/761
(58) Field of Classification Search ............ 29/830–834, 29/852; 174/260, 261; 361/760, 761
See application file for complete search history.

(56) References Cited

U.S. PATENT DOCUMENTS

| | | | |
|---|---|---|---|
| 3,185,952 A | 5/1965 | Potter et al. | |
| 4,884,170 A | 11/1989 | Ohki et al. | |
| 4,908,087 A | 3/1990 | Murooka et al. | |
| 6,487,083 B1 | 11/2002 | Kwong | |
| 6,494,361 B1 * | 12/2002 | Scanlan et al. | 228/223 |
| 6,765,299 B2 | 7/2004 | Takahashi et al. | |
| 6,850,394 B2 | 2/2005 | Kim | |
| 7,057,290 B2 | 6/2006 | Sunohara et al. | |
| 7,176,604 B2 | 2/2007 | Nakatani | |
| 7,327,603 B2 | 2/2008 | Roehr | |
| 2003/0147197 A1 | 8/2003 | Uriu et al. | |
| 2004/0062019 A1 | 4/2004 | Akama | |
| 2004/0169277 A1 | 9/2004 | Matsuda | |
| 2004/0183192 A1 | 9/2004 | Otsuka et al. | |
| 2005/0057307 A1 | 3/2005 | Zhang et al. | |
| 2005/0112798 A1 | 5/2005 | Bjorbell | |
| 2006/0108144 A1 | 5/2006 | Shizuno | |
| 2006/0172562 A1 | 8/2006 | Weidner | |
| 2007/0250084 A1 | 10/2007 | Sharkawy et al. | |
| 2008/0000681 A1 | 1/2008 | Nakamura | |

FOREIGN PATENT DOCUMENTS

| | | | |
|---|---|---|---|
| JP | 2001148457 A | | 5/2001 |
| JP | 2001257310 A | | 9/2001 |
| JP | 2003-347502 | | 12/2003 |
| JP | 2004247475 A | | 9/2004 |
| WO | WO 2004001848 A1 * | | 12/2003 |

* cited by examiner

*Primary Examiner* — A. Dexter Tugbang
*Assistant Examiner* — Azm Parvez
(74) *Attorney, Agent, or Firm* — Volentine & Whitt, PLLC

(57) ABSTRACT

A circuit board has an embedded electronic component such as an integrated circuit chip with a wafer level chip size package. A via hole extends through the electronic component. Another via hole extends through the substrate or prepreg on which the electronic component is mounted inside the circuit board. Conductors in the via holes enable a terminal on the surface of the electronic component to be electrically connected to a wiring pattern or another electronic component on the opposite side of the substrate or prepreg. Routing the connection through the electronic component itself saves space and reduces the length of the connection.

8 Claims, 4 Drawing Sheets

CIRCUIT BOARD WITH EMBEDDED COMPONENT AND METHOD OF MANUFACTURING SAME

CROSS-REFERENCE TO RELATED APPLICATIONS

This is a divisional of Application No. 11/273,339, now U.S. Pat. No. 7,989,706, filed Nov. 15, 2005, which is incorporated herein by reference in its entirety.

BACKGROUND OF THE INVENTION

1. Field of the Invention

The present invention relates to a printed circuit board having an embedded electronic component with a via hole.

2. Description of the Related Art

It is known technology to embed passive electronic components such as resistors and capacitors and active electronic components such as integrated circuit chips in a printed circuit board, to increase the mounting density of the board. Embedded integrated circuit chips must have small packages, so it is advantageous to use chip scale packages, which are barely larger than the integrated circuit chip itself, or chip size packages, which in plan view are the same size as the chip itself. Recently, wafer level chip size packages have become prevalent. A wafer level chip size package (WCSP) is simply a dielectric layer covering the chip surface on which the integrated circuit is created, with conductive terminals such as solder bumps providing electrical access to the integrated circuitry. This type of package is formed on the semiconductor wafer from which the chip is fabricated, before the wafer is diced into individual chips.

A conventional process for forming a circuit board with embedded WCSP components is illustrated in FIGS. 1 to 3.

In FIG. 1, WCSP components 1 that have been tested after package formation and are known to be non-defective are attached to a substrate 2 by means of a die bonding adhesive 3. Next, the surface of the substrate 2 on which the WCSP components 1 are mounted is sealed with a dielectric layer 4 that surrounds and protects the WCSP components 1 as shown in FIG. 2. A second dielectric layer 5 is formed on the first dielectric layer 4; then a conductive wiring pattern 7 is formed on the second dielectric layer 5, making electrical contact with the WCSP components 1 through openings in the second dielectric layer 5. Next, a further dielectric layer 6 is formed, covering the conductive wiring pattern 7, and solder balls 8 are formed as external terminals to complete the circuit board, as shown in FIG. 3.

In a variant of this process, the first two dielectric layers 4, 5 are formed simultaneously.

FIG. 4 shows a conventional circuit board 20 having components 10, 11, 12 mounted on its surfaces as well as having an embedded WCSP component 21. The WCSP component 21 is attached to a substrate 13 by a die bonding adhesive 14 and is sealed in a first dielectric layer 15, which is covered by a second dielectric layer 16. (The two dielectric layers 15, 16 may be formed as a single combined layer.) A conductive wiring pattern 17 is formed on dielectric layer 16, and the first semiconductor device 10 and the chip component 12 are mounted in electrical contact with the wiring pattern 17. Another wiring pattern 19 formed on the opposite side of the circuit board 20, on the undersurface of the substrate 13, and the second semiconductor device 11 is mounted on this surface, making electrical contact with the wiring pattern 19. The semiconductor devices 10, 11 are, for example, integrated circuit devices. The chip component 12 may be either an active component or a passive component.

The first semiconductor device 10 is electrically coupled to the second semiconductor device 11 through the wiring patterns 17, 19 and a conductive member or conductor 18 formed in a via hole extending from one surface to the other surface of the circuit board 20. The WCSP component 21 is electrically coupled to the first semiconductor device 10 through wiring pattern 17, and to the second semiconductor device 11 through the wiring patterns 17, 19 and a conductor 22 formed in another via hole. Further information can be found in Japanese Patent Application Publication No. 2003-347502.

One problem with the conventional circuit board 20 in FIG. 4 is that the long length of the electrical connection indicated by the arrow 23 from the WCSP component 21 through wiring pattern 17, conductor 22, and wiring pattern 19 to the second semiconductor device 11 impedes the high-speed transmission of electrical signals from the WCSP component 21 to this semiconductor device 11.

As the complexity of the semiconductor devices mounted on circuit boards increases year by year, the complexity of the wiring patterns on their surfaces and the number of electrical connections necessary between the surfaces also increases, requiring a large number of via holes to be formed. The embedding of WCSP components in such a circuit board is subject to layout constraints, not only because the embedded WCSP components must avoid the numerous via holes, but also because the embedded WCSP components require the formation of additional via holes for electrical connections that pass between the two surfaces of the circuit board as illustrated in FIG. 4. These constraints pose another problem; if they could be partially removed, additional layout space could be obtained and the component mounting density could be increased.

SUMMARY OF THE INVENTION

An object of the present invention is to increase the mounting density of circuit boards with embedded components.

Another object of the invention is to secure additional layout space for circuit boards with embedded components.

A further object of the invention is to improve the electrical characteristics of circuit boards with embedded components.

A still further object is to improve the productivity of the circuit board manufacturing process.

The invention provides a circuit board having a substrate and first and second electronic components mounted on opposite surfaces of the substrate. The first electronic component has a first conductor formed on the surface distant from the substrate, a hole extending from this surface to the surface adjacent the substrate, and a second conductor disposed in this hole. The substrate has a similar hole extending from one surface to the opposite surface, and a third conductor disposed in this hole. The first electronic component is embedded in a dielectric layer. The second electronic component is electrically coupled to the first electronic component through the second and third conductors.

The first electronic component may have a wafer level chip size package with additional conductors formed on the same surface as the first conductor. The above dielectric layer may be sandwiched between the substrate and a second surface of the circuit board, on which is formed a wiring pattern to which the additional conductors are connected, the first electronic component thus being embedded inside the circuit board.

The invention also provides a method of forming a circuit board having an embedded electronic component. A substrate is prepared having wiring patterns on both surfaces, additional conductors formed on one surface, a hole extending from this surface to the other surface, and another conductor formed in the hole.

An electronic component with conductors and a hole as described above is mounted on the substrate so that the first conductor and additional conductors on the surface of the electronic component make electrical contact with the conductors on the surface of the substrate. A first preimpregnated glass cloth or 'prepreg', having an opening accommodating the electronic component, is laminated onto this surface of the substrate. A second prepreg is laminated onto the opposite surface of the substrate. A third prepreg is laminated onto the first prepreg. The second and third prepregs have conductors formed on their exposed surfaces. A hole is formed in the third prepreg, and a conductor is formed in this hole. The conductor on the exposed surface of the third prepreg is patterned. An electrical path is formed from the resulting pattern through the conductors in the holes in the third prepreg and the electronic component to the first conductor on the surface of the electronic component.

The invention provides another method of manufacturing a circuit board. An electronic component with conductors and a hole as described above is mounted on one surface of a first prepreg. A second prepreg, having an opening accommodating the electronic component, is laminated onto this surface of the first prepreg. A third prepreg is laminated onto the second prepreg. The first and third prepregs have conductors formed on their exposed surfaces. A hole is formed extending through the first prepreg, and a conductor is formed in this hole. The conductors on the surfaces of the first and third prepregs are then patterned. An electrical path is formed from the resulting pattern on the surface of the first prepreg through the conductors in the holes in the first prepreg and the electronic component to the first conductor on the surface of the electronic component.

When a conductor on the surface of an electronic component embedded in a circuit board must be electrically connected to a point on the distant surface of the substrate or prepreg on which the electronic component is mounted, routing the connection through a hole in the electrical component itself as described above saves space and shortens the length of the connection, thereby improving the electrical characteristics of the circuit board and enabling components to be more densely mounted.

By using prepregs with openings accommodating the embedded electronic component, the invented methods of manufacturing the circuit board simplify the manufacturing process and improve productivity.

DETAILED DESCRIPTION OF THE INVENTION

Figure 1:
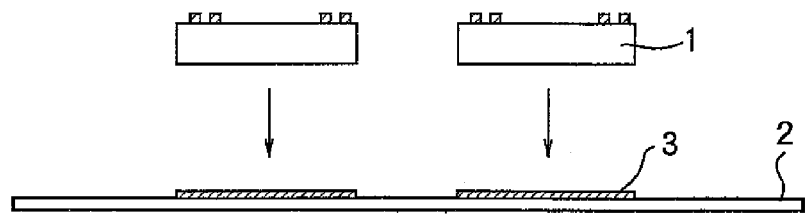
FIGS. 1, 2, and 3 show steps in the fabrication of a conventional circuit board including an embedded electronic component of the WCSP type.
Figure 2:
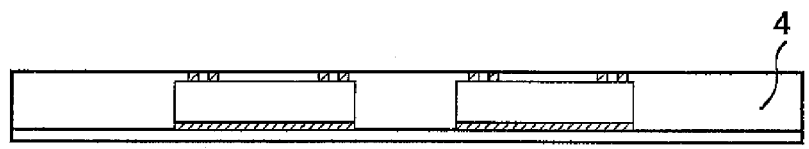
Figure 3:
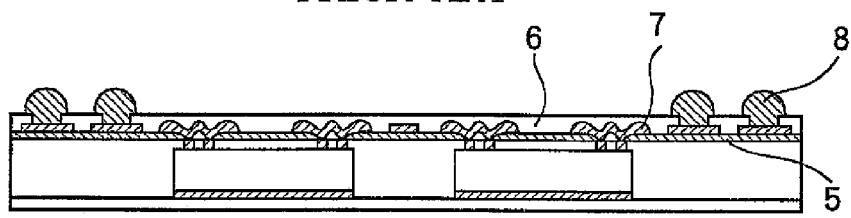
Figure 4:
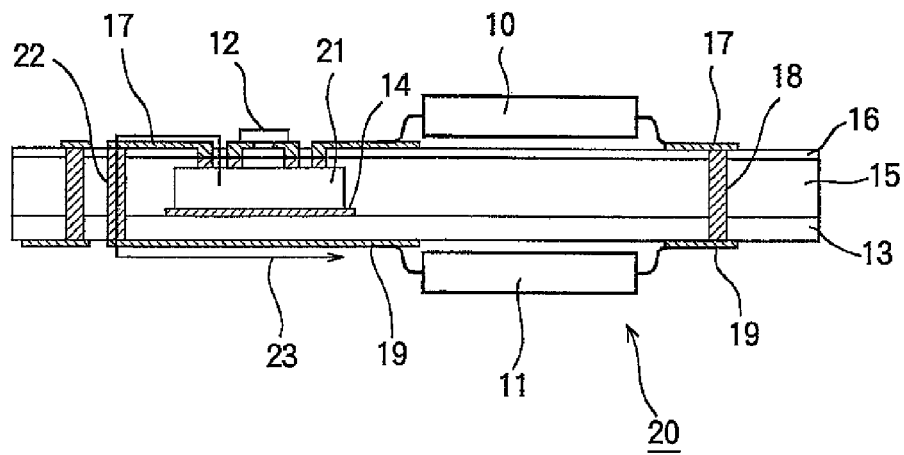
FIG. 4 is a schematic sectional view of another conventional circuit board including an embedded electronic component of the WCSP type.

Embodiments of the invention will now be described with reference to the attached drawings, in which like elements are indicated by like reference characters.

First Embodiment

Figure 5:
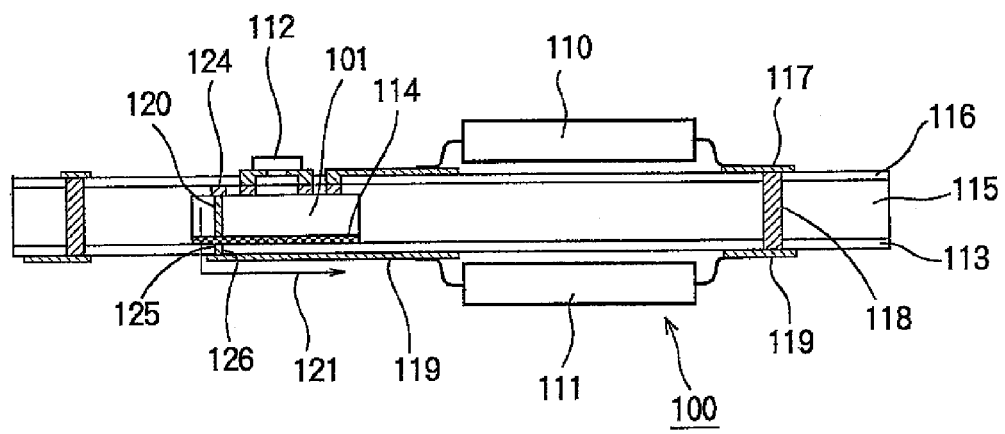
FIG. 5 is a schematic sectional view of a circuit board including an embedded semiconductor device of the WCSP type according to a first embodiment of the invention.

Referring to FIG. 5, a circuit board 100 in the first embodiment of the invention includes an embedded WCSP component 101, semiconductor devices 110, 111, and a chip component 112.

The embedded WCSP component 101 is attached to a substrate 113 by means of a die bonding adhesive 114 and is sealed with a dielectric layer 115 on which a further dielectric layer 116 is formed. The two dielectric layers 115, 116 may be formed simultaneously as a single layer. The embedded WCSP component 101 is an integrated circuit with circuit elements and interconnections (not shown) disposed near the upper surface in the drawing.

Dielectric layer 116 forms the first surface of the circuit board 100, on which semiconductor device 110 and chip component 112 are mounted. The undersurface of the substrate 113 forms the second surface of the circuit board 100, on which semiconductor device 111 is mounted. Semiconductor device 110 and chip component 112 make electrical contact with a wiring pattern 117 formed on dielectric layer 116 on the first surface of the circuit board 100; semiconductor device 111 makes electrical contact with a wiring pattern 119 formed on the second surface of the circuit board 100.

The semiconductor devices 110, 111 are, for example, semiconductor integrated circuits. The chip component 112 may be an active electronic component such as a transistor or a semiconductor integrated circuit chip, or a passive electronic component such as a capacitor or a resistor.

Semiconductor device 110 is electrically coupled to semiconductor device 111 through the wiring patterns 117, 119 and a conductor 118 formed in a hole extending from the first surface to the second surface of the circuit board 100.

Figure 6:
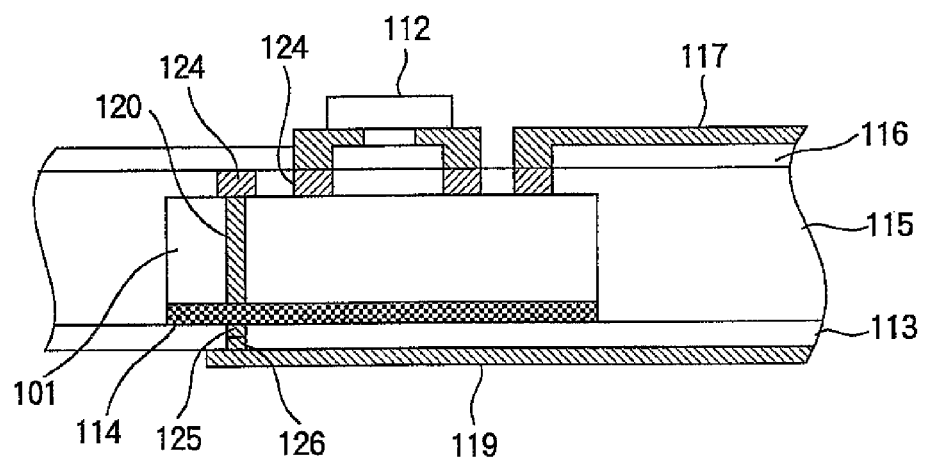
FIG. 6 is an enlarged sectional view of the embedded semiconductor device and the surrounding area in FIG. 5.

FIG. 6 shows an enlarged sectional view of the embedded WCSP component 101 and the surrounding area in FIG. 5. The WCSP component 101 has a first surface on which electrode pads 124 are formed and a second surface, opposite the first surface, on which an electrode pad 125 is formed. The circuitry formed in the WCSP component 101 is disposed near its first surface and is electrically connected to wiring pattern 117 through the electrode pads 124 formed on that surface. In the substrate 113, a conductor 126 is disposed in a hole opened so as to expose the electrode pad 125 on the second surface of the WCSP component 101. The WCSP component 101 additionally has a conductor 120 formed in a hole extending through the WCSP component 101 from its first surface to its second surface, aligned with one of the electrode pads 124 on the first surface and the electrode pad 125 on the second surface. An electronic circuit element (not shown) in the WCSP component 101 is electrically coupled to the semiconductor device 111 mounted on the second surface of the circuit board 100 through the conductor 120 formed in this hole, the electrode pads 124, 125 at the ends of the hole, conductor 126, and wiring pattern 119. The arrow 121 in FIG. 5 indicates the path of the electrical connection between the WCSP component 101 and the semiconductor device 111.

As described above, according to the first embodiment, the circuit board 100 includes an embedded WCSP component 101 that has a conductor 120 formed in a hole extending through the WCSP component 101 from its first surface to its second surface, thereby enabling an electrode pad 124 on the first surface to be electrically connected to a semiconductor device 111 on the far side of the circuit board 100 without requiring the connection path to detour around the WCSP component 101 through a separate via hole in the circuit board 100. The length of the electrical connection between the WCSP component 101 and the semiconductor device 111 mounted on the second surface of the circuit board 100 is thereby reduced, improving the electrical characteristics of the connection and reducing the signal propagation delay between the WCSP component 101 and semiconductor device 111. The number of via holes that must be formed in the circuit board 100 is also reduced, and the amount of wiring in the wiring patterns 117, 119 on the surfaces of the circuit board 100 is reduced, providing additional layout space on the surfaces of the circuit board 100 so that the component mounting density can be increased.

Second Embodiment

The invention can also be practiced in multi-layer circuit boards. FIGS. 7 to 10 show steps in the fabrication of a four-layer circuit board 300 including a pair of embedded WCSP components 306.

Figure 7:
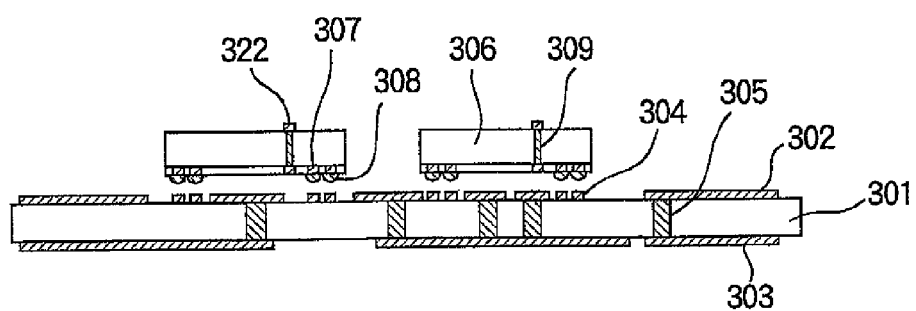
FIGS. 7, 8, 9, and 10 show steps in the fabrication of a circuit board including an embedded electronic component of the WCSP type according to a second embodiment of the invention.

Referring to FIG. 7, a substrate 301 is prepared. The substrate 301 has two major surfaces: a first surface on which a wiring pattern 302 and a plurality of electrode pads 304 are formed, and a second surface, opposite the first surface, on which a wiring pattern 303 is formed. The substrate 301 additionally has conductors 305 disposed in holes extending through the substrate 301 from the first surface to the second surface. Each WCSP component 306 has a first surface on which a plurality of electrode pads 307 and external terminals 308 are formed, and a second surface, opposite the first surface, on which an electrode pad 322 is formed. A hole extends through each WCSP component 306 from the first surface to the second surface. A conductor 309 is formed in this hole, electrically coupling the electrode pad 322 on the second surface to one of the electrode pads 307 on the first surface.

The external terminals 308 make electrical contact with respective electrode pads 307 on the first surface of the WCSP components 306. The external terminals 308 may be solder bumps formed on the respective electrode pads 307. The electrode pad 307 that is electrically connected through the hole in each WCSP component 306 to the electrode pad 322 its the second surface does not have an external electrode 308.

Figure 8:
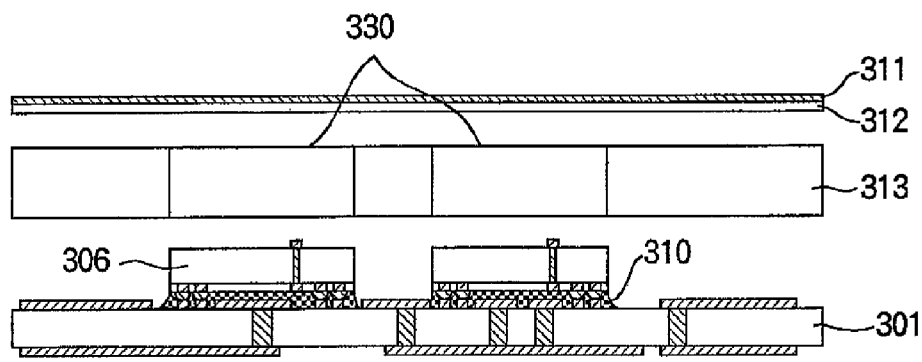

Referring to FIG. 8, flux or solder paste is applied to the electrode pads 304 on the first surface of the substrate 301 by a screen printing technique; then the WCSP components 306 are mounted on the first surface of the substrate 301 so that the external terminals 308 on the first surfaces of the WCSP components 306 align with the electrode pads 304 on the first surface of the substrate 301. The external terminals 308 of the WCSP components 306 are then mechanically and electrically joined to the electrode pads 304 of the substrate 301 by reflow soldering. If necessary, flux residue and the like are removed in a cleaning process after the reflow process. The remaining space between the WCSP components 306 and the substrate 301 is filled with, for example, an epoxy resin filler 310.

Three prepregs are now prepared: a first prepreg 313 that has openings 330 for the WCSP components 306; a second prepreg 314 clad with copper foil 315 on one surface; and a thin third prepreg 312 likewise clad with copper foil 311 on one surface.

Figure 9:
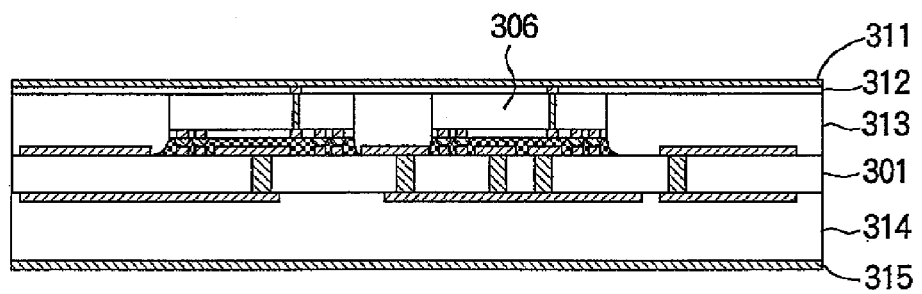

Referring to FIG. 9, the first prepreg 313 is laminated onto the first surface of the substrate 301, the WCSP components 306 fitting into the openings in the first prepreg 313. The second prepreg 314 is laminated onto the second surface of the substrate 301, so that the second surface of the substrate 301 meets the unclad surface of the second prepreg 314 (the surface that is not clad with copper foil). The third prepreg 312 is laminated onto the first prepreg 313, so that the first prepreg 313 meets the unclad surface of the third prepreg 312. Thus the substrate 301 is disposed between prepregs 313 and 314, and the WCSP components 306 are embedded between the substrate 301 and the thin prepreg 312.

Figure 10:
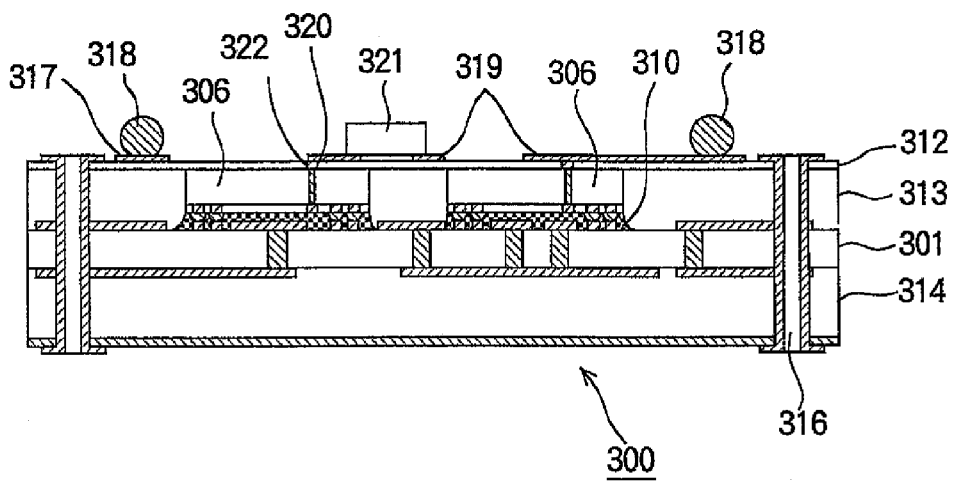

Referring to FIG. 10, to complete the four-layer circuit board 300, holes extending to the electrode pads 322 on the second surfaces of the WCSP components 306 are opened by cutting the thin prepreg 312 by laser, and conductors 320 are formed in these holes. In addition, via holes are formed in the circuit board 300, extending through the prepregs 312, 313, 314 and the substrate 301, and conductors 316 are formed in these via holes, making electrical contact with the wiring patterns 302, 303 on the substrate 301 and copper foil conductors formed on the surfaces of the circuit board 300. The upper copper foil conductor (the copper foil cladding 311 of the thin prepreg 312) is patterned to form a wiring pattern 319 with lands 317 to which external terminals such as solder balls 318 can be attached. This wiring pattern 319 is electrically coupled to the electrode pads 322 of the WCSP components 306 through the conductors 320 disposed in the holes. Besides the solder balls 318 formed on the lands 317, a chip component 321 is mounted on the thin prepreg 312, making electrical contact with the wiring pattern 319.

One of the embedded WCSP components 306 is electrically connected to the chip component 321 through the conductor in the hole extending through the WCSP component, the electrode pad 322 on its surface, the conductor 320 disposed in the corresponding laser-cut hole in the thin prepreg 312, and the wiring pattern 319. The other embedded WCSP component 306 is electrically connected in a similar fashion to one of the solder balls 318. As in the first embodiment, these connections are comparatively short: they do not have to be routed through the wiring patterns on the substrate 301, detour around the WCSP components 306, or pass through via holes external to the WCSP components 306; instead, they pass directly through holes in the WCSP components 306 themselves.

The use of a prepreg 313 having openings 330 that accommodate the WCSP components 306 enables the circuit board 300 including the embedded WCSP components 306 to be formed in a simple laminating process, irrespective of surface irregularities of the substrate 301, whereby the productivity of the circuit board manufacturing process can be improved.

In a variation of the second embodiment, the orientation of the WCSP components 306 is vertically reversed, so that the first surface with electrode pads 307 and external terminals 308 is adjacent the thin prepreg 312 and the second surface with electrode pad 322 is adjacent the substrate 301. The external terminals 308 are joined to electrode pads on the thin prepreg 312 by reflow soldering, and the electrode pads 322 at the ends of the holes penetrating through the WCSP components 306 are electrically connected to the wiring pattern 302 on the facing surface of the substrate 301.

Third Embodiment

The prepreg method illustrated in the second embodiment can also be used to fabricate a circuit board of the type described in the first embodiment. As a third embodiment of the invention, FIGS. 11 to 14 show steps in the fabrication of such a circuit board 400 including an embedded WCSP component 101.

Figure 11:
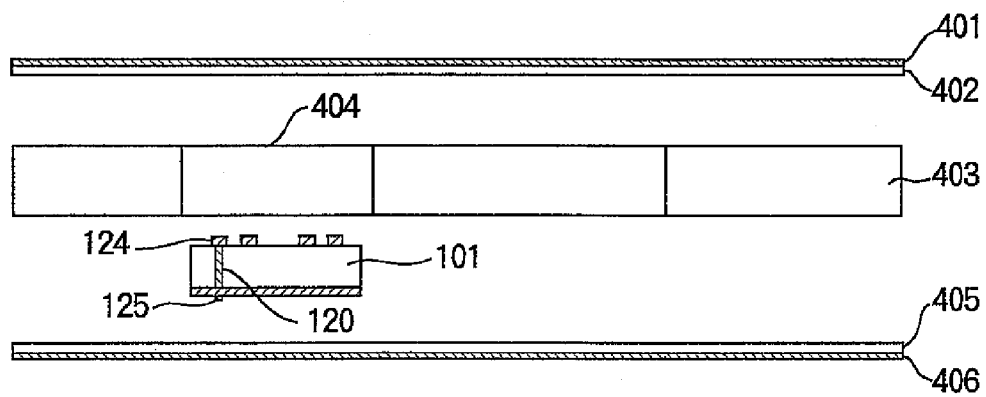
FIGS. 11, 12, 13, and 14 show steps in the fabrication of a circuit board including an embedded electronic component of the WCSP type according to a third embodiment of the invention.

Referring to FIG. 11, the WCSP component 101 has the structure described in the first embodiment, with a conductor 120 in a hole electrically connecting one of a plurality of electrode pads 124 formed on one major surface to an electrode pad 125 formed on the other major surface.

As in the second embodiment, three prepregs are prepared: a first prepreg 405 clad on one surface with copper foil 406, a second prepreg 403 having an opening 404 for the WCSP component 101, and a third prepreg 402 clad on one surface with copper foil 401.

Figure 12:
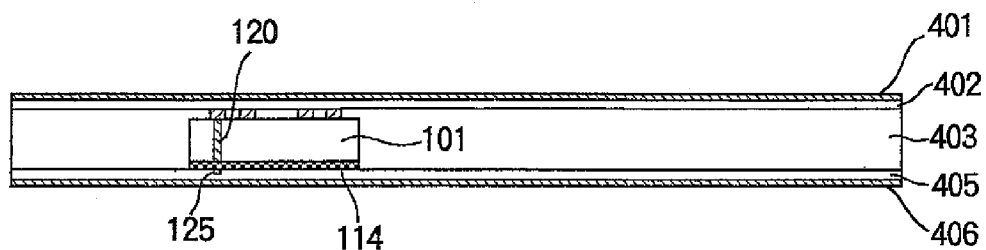

Referring to FIG. 12, the WCSP component 101 is attached to the unclad surface of the first prepreg 405 by a die bonding adhesive 114. The second prepreg 403 is laminated onto the same surface of prepreg 405 so that the opening 404 accommodates the WCSP component 101. The third prepreg 402 is laminated onto the second prepreg 403 so that the unclad surface with the third prepreg 402 meets the second prepreg 403. The copper foil cladding 401 is at this stage electrically isolated from the WCSP component 101.

Figure 13:
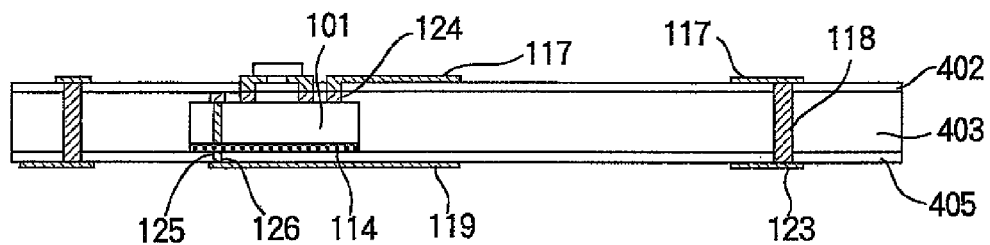

Referring to FIG. 13, via holes extending through all three prepregs 402, 403, 405 are formed, and conductors 118 are formed in these holes. A hole is formed by cutting the first prepreg 405 by laser so as to expose electrode pad 125 of the WCSP component 101, and a conductor 126 is formed in this hole. Similar holes and conductors are formed in the third prepreg 402 to provide electrical paths to the electrode pads 124 on the opposite surface of the WCSP component 101. The copper foil cladding 401 on the third prepreg 402 is patterned to form a wiring pattern 117, and the copper foil cladding 406 on the first prepreg 405 is patterned to form a wiring pattern 119, which is electrically coupled to wiring pattern 117 through conductors 118. The WCSP component 101 is electrically coupled to wiring pattern 119 through electrode pad 125 and the conductor 126 disposed in the hole in the first prepreg 405.

Figure 14:
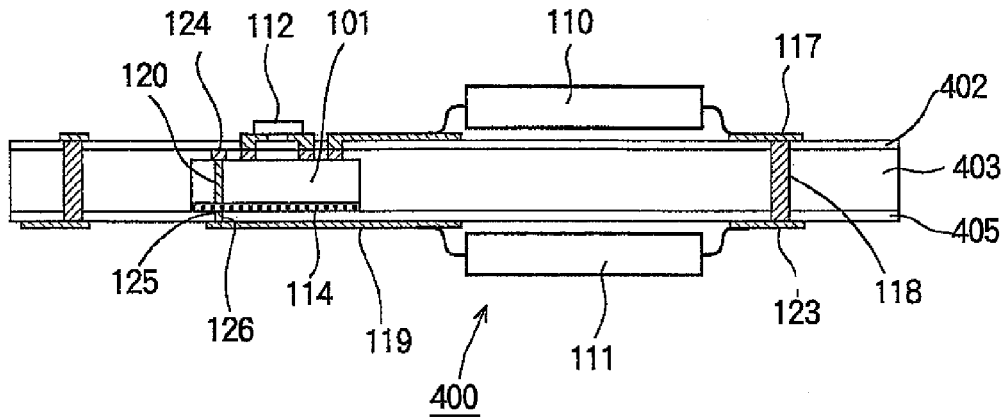

Referring to FIG. 14, a semiconductor device 110 and a chip component 112 are mounted on the surface of the third prepreg 402. Another semiconductor device 111 is mounted on the surface of the first prepreg 405. Semiconductor device 110 is electrically coupled to semiconductor device 111 through wiring pattern 117, a conductor 118, and wiring pattern 119. The WCSP component 101 is electrically coupled to the semiconductor device 111 through conductor 120, electrode pad 125, conductor 126, and wiring pattern 119.

Use of a prepreg 403 having an opening 404 accommodating a WCSP component 101 enables a circuit board 400 including an embedded WCSP component 101 to be formed in a simple laminating process, whereby the productivity of the circuit board manufacturing process can be improved. Compared with the second embodiment, since the circuit board has fewer layers, the manufacturing process is simpler and the thickness of the circuit board 400 can be reduced.

Although a circuit board with solder balls formed on external terminals was shown in the second embodiment, the invention is not limited to this structure. A connector or socket of the type generally used on mother and daughter boards may be utilized for electrical connections to other circuit boards and components (not shown).

Although circuit boards including simple embedded WCSP components were described in the embodiments above, the embedded circuitry may be more complex. For example, an embedded WCSP component may have peripheral components, also embedded in the circuit board, to which the WCSP component is connected through the wiring patterns. Alternatively, a multi-chip package or module may be embedded as a single unit. Such an embedded package or module may include both active and passive electronic components. An embedded WCSP component may also include both active and passive circuitry.

The embedded component is not necessarily a WCSP component. The embedded component may be, for example, a passive component with a silicon or ceramic substrate having a conductor formed in a hole in this substrate.

Although prepregs having surface-to-surface openings were used in the second and third embodiments, the embodiments are not limited to this structure. Countersunk prepregs may be used instead, or sheet prepregs made of a resin with high fluidity may be used.

The method of forming holes in the prepregs is not limited to the laser cutting method mentioned in the second and third embodiments. The thin prepregs in particular may be replaced by sheets of a photosensitive material, in which case holes may be formed by photolithography.

Those skilled in the art will recognize that further variations are possible within the scope of the invention, which is defined in the appended claims.

What is claimed is:
1. A method of forming a circuit board having an embedded electronic component, comprising:
preparing a substrate having a first surface, a first wiring pattern and a plurality of first conductors formed on the first surface, a second surface opposite the first surface, a second wiring pattern formed on the second surface, and a second conductor disposed in a first hole extending through the substrate from the first surface to the second surface, the second conductor being connected to at least the first conductors at the first surface of the substrate;
preparing a first electronic component having a third surface, a plurality of third conductors formed on the third surface, a fourth surface opposite the third surface, and a fourth conductor disposed in a second hole extending through the first electronic component from the third surface to the fourth surface;
mounting the first electronic component on the first surface of the substrate so that the plurality of first conductors make electrical contact with the plurality of third conductors;
laminating a first prepreg onto the first surface of the substrate, the first prepreg having an opening for accommodating the first electronic component;
laminating a second prepreg onto the second surface of the substrate, the second prepreg having a fifth surface, a fifth conductor formed on the fifth surface, and a sixth surface opposite the fifth surface, the sixth surface of the second prepreg meeting the second surface of the substrate;
laminating a third prepreg onto the first prepreg, the third prepreg having a seventh surface, a sixth conductor formed on the seventh surface, and an eighth surface opposite the seventh surface, the eighth surface of the third prepreg meeting the first prepreg;
forming a third hole in the third prepreg, extending from the seventh surface to the eighth surface;
forming a seventh conductor in the third hole; and
patterning the sixth conductor.
2. The method of claim 1, further comprising filling a space between the first electronic component and the first surface of the substrate with resin.

3. The method of claim 1, wherein the third hole is formed by use of a laser.

4. The method of claim 1, further comprising:
applying flux and solder paste to surfaces of the plurality of first conductors; and
joining the plurality of first conductors mechanically and electrically to the plurality of third conductors by reflow soldering.

5. The method of claim 4, wherein the flux and solder paste are applied by screen printing.

6. The method of claim 4, further comprising removing flux residue after the reflow soldering.

7. A method of forming a circuit board having an embedded electronic component, comprising:
preparing a first electronic component having a first surface, a first conductor formed on the first surface, a second surface opposite the first surface, and a second conductor disposed in a first hole extending through the first electronic component from the first surface to the second surface;
mounting the first electronic component on a first prepreg having a third surface and a fourth surface, the first electronic component being mounted on the third surface, a third conductor being formed on the fourth surface;
laminating a second prepreg onto the third surface of the first prepreg, the second prepreg having an opening accommodating the first electronic component;
laminating a third prepreg onto the second prepreg, the third prepreg having a fifth surface meeting the second prepreg, a sixth surface opposite the fifth surface, and a fourth conductor formed on the sixth surface;
forming a second hole extending through the first prepreg from the third surface to the fourth surface;
forming a fifth conductor in the second hole, the fifth conductor being connected to at least the second conductor at the third surface of the first prepreg; and
patterning the third and fourth conductors.

8. The method of claim 7, wherein the second hole is formed by use of a laser.

* * * * *